United States Patent [19]

Mower et al.

[11] Patent Number: 4,749,960
[45] Date of Patent: Jun. 7, 1988

[54] LONG PHASE-LOCKED CARRIER RECOVERY LOOP

[75] Inventors: Vaughn L. Mower, Bountiful; Merle L. Keller, Jr., Salt Lake City, both of Utah

[73] Assignee: Unisys Corporation, Blue Bell, Pa.

[21] Appl. No.: 36,638

[22] Filed: Apr. 10, 1987

[51] Int. Cl.[4] .............................................. H03L 7/12
[52] U.S. Cl. ......................................... 331/4; 331/11; 331/25
[58] Field of Search ...................... 331/1 A, 10, 11, 17, 331/25, 4; 358/148, 158

[56] References Cited
U.S. PATENT DOCUMENTS 4,423,390 12/1983 Waters .................................... 331/4
4,616,191 10/1986 Galani et al. ...................... 331/17 X
4,649,551 3/1987 Sander et al. ...................... 331/17 X

*Primary Examiner*—Gene Wan
*Assistant Examiner*—Robert J. Pascal
*Attorney, Agent, or Firm*—John B. Sowell; L. J. Marhoefer; T. J. Scott

[57] ABSTRACT

A long phase-locked loop circuit is provided which has an electronic closure circuit in series in the loop. The loop is effectively an open loop until acquisition of the incoming signal at which time the electronic closure circuit closes the phase-locked loop. A novel coincidence circuit is provided which compares the carrier in the loop with a reference frequency and when the two frequencies are equal the coincidence circuit closes the electronic closure circuit.

9 Claims, 4 Drawing Sheets

BPSK WAVE FORM

CARRIER → TIME

DATA, RATE
R_D BIT/SEC.  → TIME

LONG PHASE-LOCKED CARRIER RECOVERY LOOP

BACKGROUND OF THE INVENTION

1. Field of the Invention

This invention relates to a carrier recovery loop. More particularly this invention relates to a long phase-locked loop for carrier recovery where the loop bandwidth is very small compared to the carrier frequency uncertainty.

2. Description of the Prior Art

Phase-locked loops are well known and do not require a detailed description. Such prior art phase-locked loops usually employed a closed loop which has the capability to acquire the carrier naturally.

Heretofore there were long phase-locked loops which employed closed loops with means for sweeping the frequency of the voltage controlled oscillator with the loop closed. Such prior art phased-locked loops required that the sweep be extremely slow in order to acquire the signal in a noisy environment.

Heretofore the wider the band of frequency uncertainty the longer it would take to sweep out the uncertainty bandwidth. Further, the saaller the closed loop bandwidth the slower the sweep must be conducted which requires longer sweep time.

It would be extremely desirable to provide a long phase-locked carrier recovery loop which is not constrained by the closed loop bandwidth and is capable of sweeping the frequency of uncertainty much faster than has been accomplished in the prior art.

SUMMARY OF THE INVENTION

It is a principal object of the present invention to provide an improved long phase-locked loop recovery circuit.

It is another primary object of the present invention to provide a novel open phase-locked recovery loop which is capable of non-coherently detecting frequency coincidence.

It is another object of the present invention to provide a electronic loop closure circuit which is activated upon non-coherent detection of frequency coincidence.

It is another object of the present invention to provide a sweep generator which is external to the phase-locked loop and is capable of rapidly sweeping the uncertainty bandwidth.

It is another object of the present invention to provide a high speed electronic coincidence detection circuit which is external t the open phase-locked loop for activating and closing the phase-locked loop.

It is another general object of the present invention to provide a long phase-locked loop which remains open until non-coherent coincidence is detected.

According to these and other objects of the present invention there is provided a long phase-locked loop which has in the loop a electronic closure circuit coupled to the output of the phase detector. The phase detector is inoperable until frequency coincidence is detected at which time the loop is closed. The novel external coincidence circuit compares an accurate reference signal with a signal in the loop containing the frequency to be recovered and closes the electronic coincidence circuit when frequency coincidence occurs.

DESCRIPTION OF THE PREFERRED EMBODIMENT

Figure 1:
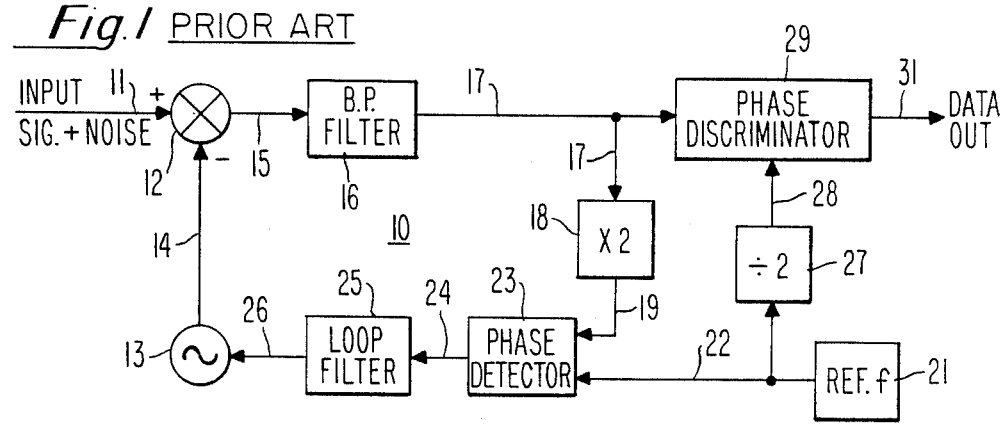
FIG. 1 is a block diagram showing a prior art long phase-locked loop.

Refer now to FIG. 1 showing a prior art type long phase-locked loop 10. Loop 10 is provided with an input line 11 having a binary phase shift keyed signal which contains noise thereon. In the preferred embodiment to be explained hereinafter the frequency of the carrier is in the order of 70 megahertz (Mhz) which would be applied to mixer 12. The output of voltage controlled oscillator 13 on line 14 would be of the order of 69.5 Mhz which is applied to mixer 12 to provide an output on line 15 at approximately 500 kilohertz (Khz). The R.F. frequency of 500 Khz is filtered in band pass filter 16 to provided an improve signal to noise ratio I.F. signal on line 17. The I.F. frequency on line 17 is applied to a multiplier 18 which doubles the frequency to 1 Mhz on line 19. An accurate reference frequency generator 21 applies a 1 Mhz signal on line 22 to phase detector 23 which produces an error signal on line 24 proportional to the phase difference of the signals on lines 19 and 22. The voltage error signal on line 24 is applied to loop filter 25 to improve the loop signal to noise ratio by averaging the output of the phase detector. The output of loop filter 25 on line 26 is applied to the voltage controlled oscillator (VCR) 13 to speed up or retard the frequency and phase of the signal of the VCR so as to reduce the phase error on line 24 to zero.

The reference signal on line 22 is applied to a divide by 2 divider 27 to provide a carrier frequency signal on line 28 that is applied to the phase discriminator 29 which removes the carrier from the input signal on line 17 to provide the data output signal o line 31.

Figure 2A:
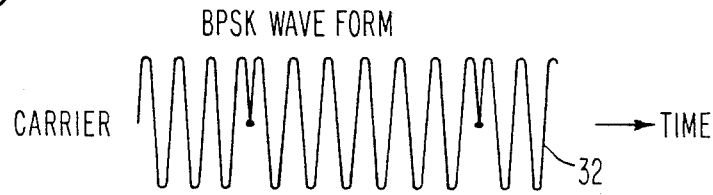
FIGS. 2A and 2B are waveforms showing the input signal in the time domain.
Figure 2B:

Refer now to FIGS. 2A and 2B showing a representation of a binary phase shift key waveform 32 which reverses its phase by 180° when it senses a transition in the baseband data rate shown as waveform 33. It will be understood that the waveform 32 cannot be illustrated to show that 70,000 sinusoidal oscillations would occur between each data bit when the data bit rate is 1000 symbols per second.

Figure 3:
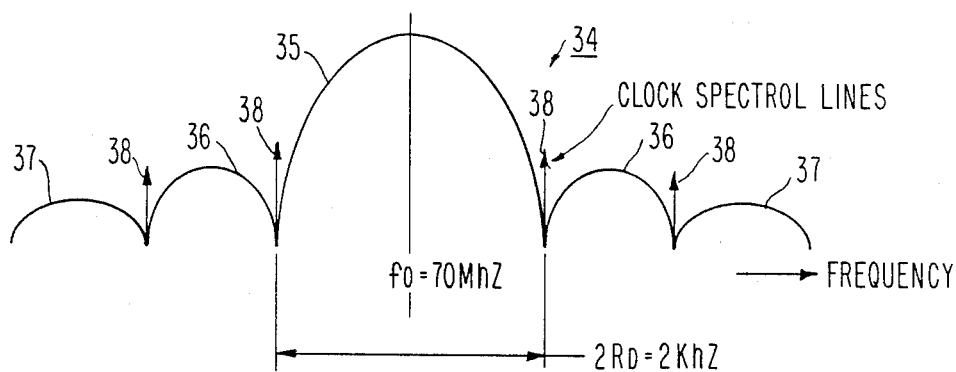
FIG. 3 is a composite of the input signals of FIG. 3 in the frequency domain adapted to illustrate the recovery problem.

Refer now to FIG. 3 showing a waveform 34 of the type which would occur on input line 11 of FIG. 1 and will be used to explained the preferred embodiment of the present invention in other Figures hereinafter. The waveform 34 is a representation of the power spectral density of the input signal on line 11. Waveform 34 comprises a main lobe 35 and side lobes 36 and 37 shown having clock spectral lines 38 which result from imperfect balance of 1s and 0s in the base band data. Having defined the data rate $R_D$ as 1000 symbols per second, the width of the main lobe is 2 Khz or twice the data frequency rate. As explained hereinbefore the center frequency of the main lobe 35 for purposes of this example was defined as being 70 Mhz. The problem that arises results from the fact that the transmitted frequency of the carrier is not a true 70 Mhz otherwise recovery would be extremely simple. The variation in center frequency can be as great as 20 times the 2 Khz band widths shown and in order to receive the data the phase locked loop must lock onto the carrier frequency.

Figure 4:
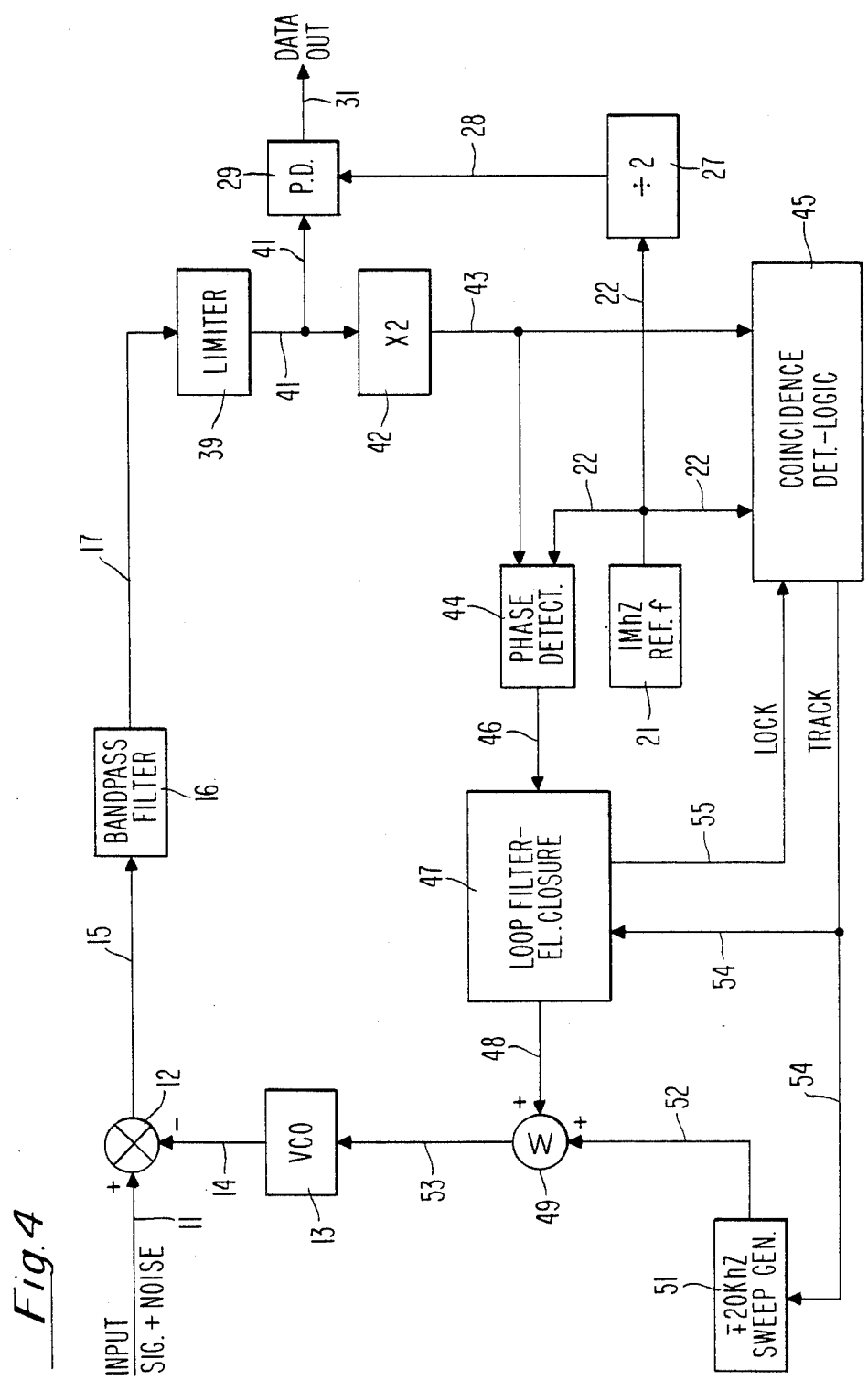
FIG. 4 is a simplified block diagram illustrating the preferred embodiment of the present invention.

Refer now to FIG. 4 showing a simplified block diagram illustrating a preferred embodiment of the present invention. Since the FIG. 4 embodiment is a improvement of the prior art type closed phase-locked recovery circuit the same numerals used in FIG. 1 are again used in FIG. 4 to illustrate the similarity of the identical components which are employed therein. Input line 11 contains the input signal described hereinbefore with respect to FIGS. 1 to 3 which is at approximately 70 Mhz and is applied to the mixer 12 to provide an output on line 15 which is applied to the bandpass filter 16 to provide a intermediate (I.F.) frequency signal which has a higher signal to noise ratio. The signal on line 17 is applied to a limiter 39 which hard limits the input waveform and provides a TTL output on line 41 which is applied to the times 2 multiplier 42. The output of multiplier 42 on line 43 is applied a phase detector 44 and to the novel coincidence and detection logic circuit 45. A 1 Mhz generator 21 provides an accurate reference signal on line 22 which is also applied to phase detector 44 to provide a voltage signal on line 46 which is representative of the phase difference between the signals on lines 22 and 43. The signal on line 46 being applied to loop filter and electronic enclosure element 47 is being applied to an open circuit and at the present time no output representative of phase difference is being produced on line 48 to summing circuit 49. A sweep generator 51 is preferably provided with a sweep of ±20 Khz with the output signal on line 52 applied to the summing circuit 49 so as to produce a sweep signal on line 53 to the voltage controlled oscillator 13. As explained hereinbefore th voltage controlled oscillator with no correction signal on it applies a signal of 69.5 Mhz to line 14 and to mixer 12 so as to provide the 500 Khz intermediate frequency signal on line 15. Since the sweep generator 51 is applying a sweep signal to the voltage controlled oscillator, the signal on line 15 is being varied ±20 Khz from the intermediate frequency of 500 Khz. Thus, the output from multiplier 42 on line 43 being applied to the coincidence detect logic circuit 45 is an intermediate frequency of 1 Mhz ±40 Khz. The reference generator 21 is applying to the coincidence circuit 45 a reference frequency of 1 Mhz. When the coincidence circuit 45 senses that the input on lines 22 and 43 are equal coincident circuit 45 produces a high track signal on line 54 denoting that coincidence has been detected. The signal on line 54 is applied to an electronic closure circuit 47 which closes an electronic switch to be explained hereinafter. Circuit 47 connects lines 46 and 48 electronically. The track signal on line 54 is applied to the sweep generator 51 to inhibit further sweeping action. The electronic closure circuit 47 when closed produces an acknowledge or lock signal on line 55 which effectively takes the coincidence detection and logic circuit out of the loop. In the remote event that the phase-locked loop is unable to lock onto the intermediate frequency on line 43, the high lock signal on line 55 goes low causing the high track signal on line 54 to go low. The coincidence detection logic circuitry 45 again attempts to detect an intermediate frequency on line 43 that is coincident with the 1 Mhz reference signal on line 22. The sweep generator 51 is activated and the electronic closure circuit 47 is deactivated during each attempt to detect coincidence.

Once the phase-locked loop has locked onto the input signal the data in the I.F. signal may be recovered by dividing the frequency on line 22 by 2 in the divide by 2 divider 27 to provide a reference frequency of 500 Khz on line 28 which is applied to the phase discriminator 29 so as to eliminate the carrier from the signal on line 41 and leave the data on output line 31.

Figure 5:
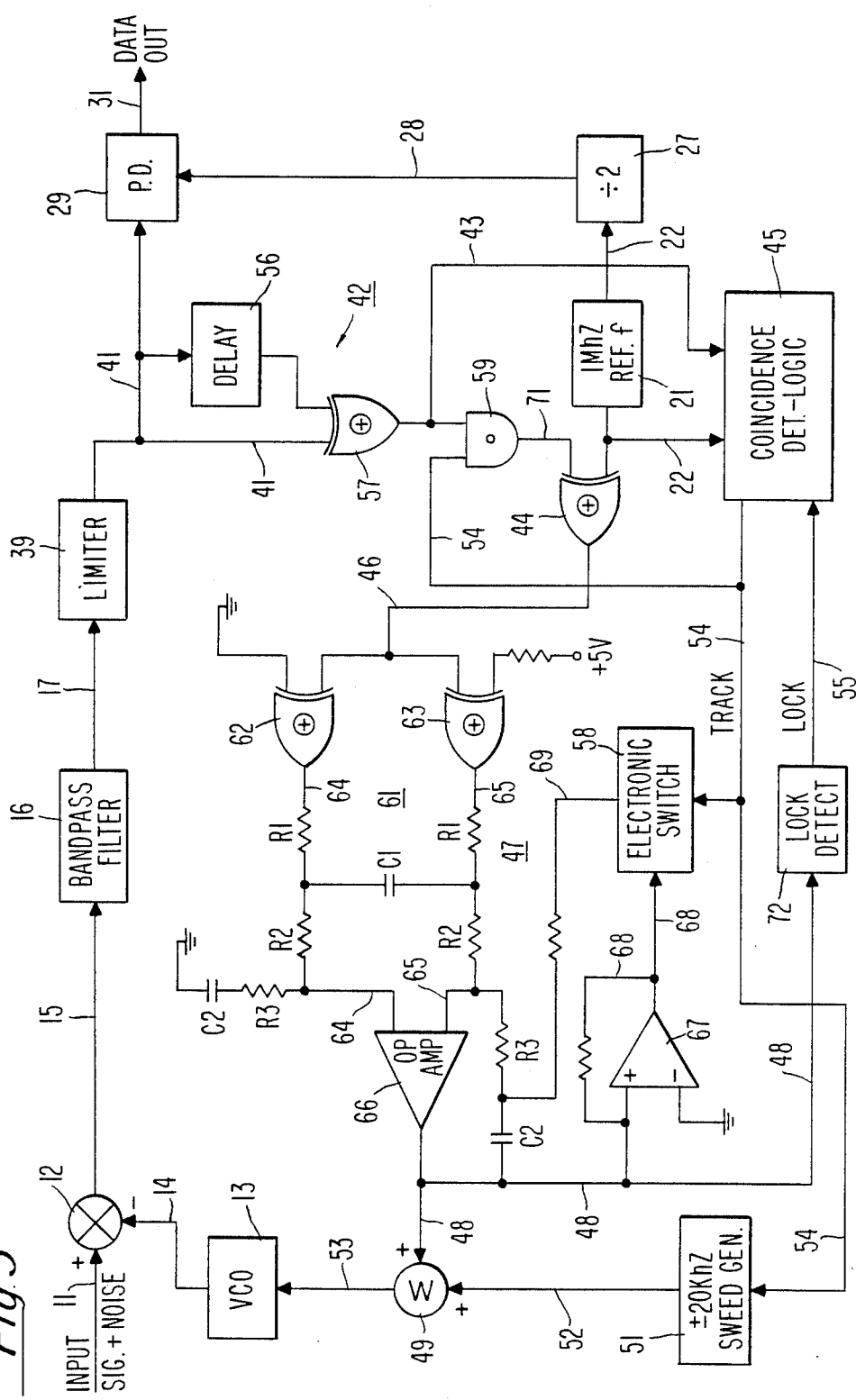
FIG. 5 is a more detailed block diagram of the FIG. 4 embodiment showing a preferred embodiment loop closure circuit.

Refer now to FIG. 5 which is nothing more than FIG. 4 modified to show the details of the loop filter and electronic closure circuitry 47. To avoid repetition, the explanation of FIG. 5 will be restricted to the operation of the structure which comprises the circuitry of loop filter and electronic closure circuitry 47 and its cooperation in the circuit of FIG. 4. The output of limiter 39 on line 41 is applied to the multiplier circuit 42 which now comprises a delay 56 and an exclusive OR gate 57. The value of the delay 56 is one-fourth of one cycle of the intermediate frequency or one-half microsecond. The delay 56 and OR gate provides a convenient way to implement a multiplier and the removal of the data spectrum and to generate a carrier spectral line at 1 Mhz. The carrier spectral line at 1 Mhz plus or minus the error of transmission is on line 43 and is applied to the coincidence detection and logic circuitry 45 as explained hereinbefore. The reference frequency on line 22 is also applied to the coincidence detection circuit 45 and operates in the manner explained hereinbefore to produce the track signal on line 54 which triggers electronic switch 58 (in the block 47 of FIG. 4). All of the circuitry between the sweep generator 51 and the coincidence detection circuit 45 plus the AND gate 59 comprises the loop filter and electronic closure circuit 47. A convenient way of implementing the phase detector in the present embodiment is by an exclusive OR gate 44. The squarewave input on line 22 from the reference frequency generator 21, being applied to the exclusive OR gate 44, is permitted to pass through to output line 46 where it is applied as a squarewave to the differential loop filter 61 whose output on line 48 is forced to an analog voltage of 0. Differential filter 61 comprises a pair of exclusive OR gates 62 and 63 which are tied to reverse polarities shown as ground and +5 volts. The output of exclusive OR gate 63 is inverted with respect to the output of exclusive OR gate 62. The differential loop filter comprises the output lines 64 and 65 which are coupled to operational amplifier 66. The lines 64 and 65 are provided with balance and loop gain resistors R1 and R2. R3 and C2 comprise the principal components of the differential loop filler 61. The capacitor C1 eliminates the high frequency components on lines 64 and 65. The output of op amp 66 on line 48 is applied to the input of comparator 67 which is shown having a ground reference input. The output of comparator 67 has a feedback loop 68 which forces the output of op amp 66 to ground or zero as will be explained hereinafter. Since comparator 67 is referenced to ground at its minus input, any deviation from ground at the positive input causes a correction or output signal on line 68 which is applied through the electronic switch 58 to line 69 and to line 65 of the op amp 66 so as to unbalance the op amp and generate an output signal on line 48 which is forced back to reference ground. It will be noted that for purposes of this invention that the electronic switch causing line 48 to be at ground maintains the loop filter of the opened phase-locked loop in constant readiness for the eventuality of loop closure. The instantaneous condition of the effectively open differential loop filter 61 is conveyed on line 48 to the summing circuit 49 so that the swept I.F. signal on line 15 reflects the instantaneous condition of the differential loop filter 61. AND gate 59 acts a the effective switch to open the loop, keeping the I.F. signal from the differential loop filter 61. When the phase-locked loop is open the track signal on line 54 is low and the signal on line 54 is applied to AND gate 59 which causes the output of AND gate 59 on line 71 to be low. Since the input on line 71 is low, the output of phase detector 44 on line 46 is a squarewave which is interpreted as being an analog voltage of zero because of the action of the differential loop filter 61. When the sweep generator 51 applies its output signal on line 52 to summing circuit 49 it causes the sweep signal on line 53 to vary the frequency of the voltage control oscillator 13 while the phase-locked loop is open. Once the 1 Mhz spectral line signal on line 43 is detected as being at the referenced frequency of 1 Mhz as the input on line 22, the track signal on line 54 goes high which immediately deactivates the electronic circuit or switch 58 and the sweep generator 51 so that the output from the electronic switch no longer affects the differential loop filter 61. The high signal on line 54 is now an input to AND gate 59. The output on line 71 is equal to the spectral line input on line 43. The phase detector 44 error signal on line 46 now has two active inputs being compared, the reference frequency of 1 Mhz and the spectral line frequency on line 71. Since the differential loop filter 61 is no longer affected by the output of the electronic switch its output on line 48 is the filtered error signal from line 46 which is now applied to the voltage controlled oscillator 13 via line 53 and summing circuit 49 without change.

Having explained how an open long phase-locked loop may be closed electronically by removal of the suppression signal, it will be appreciated that the switching action is instantaneous and at the time the reference frequency matches the spectral frequency. The phase detector is instantaneously placed in the loop circuit and all outside extraneous signals are removed. In the remote event that the input signal on line 11 goes away or a lock is not achieved, the output signal on line 48 will now slew either positive or negative and will be detected by a window type detector 72 which produces the lock or not lock signal on line 55. Until the lock signal on line 55 is achieved, the coincidence circuit maintains its low output or NOT track output on line 54. The lock signal on line 55 will force the coincidence circuit 45 to again go low and attempt to detect an intermediate frequency on line 43 that is coincident with the 1 Mhz reference signal on line 22.

Figure 6:
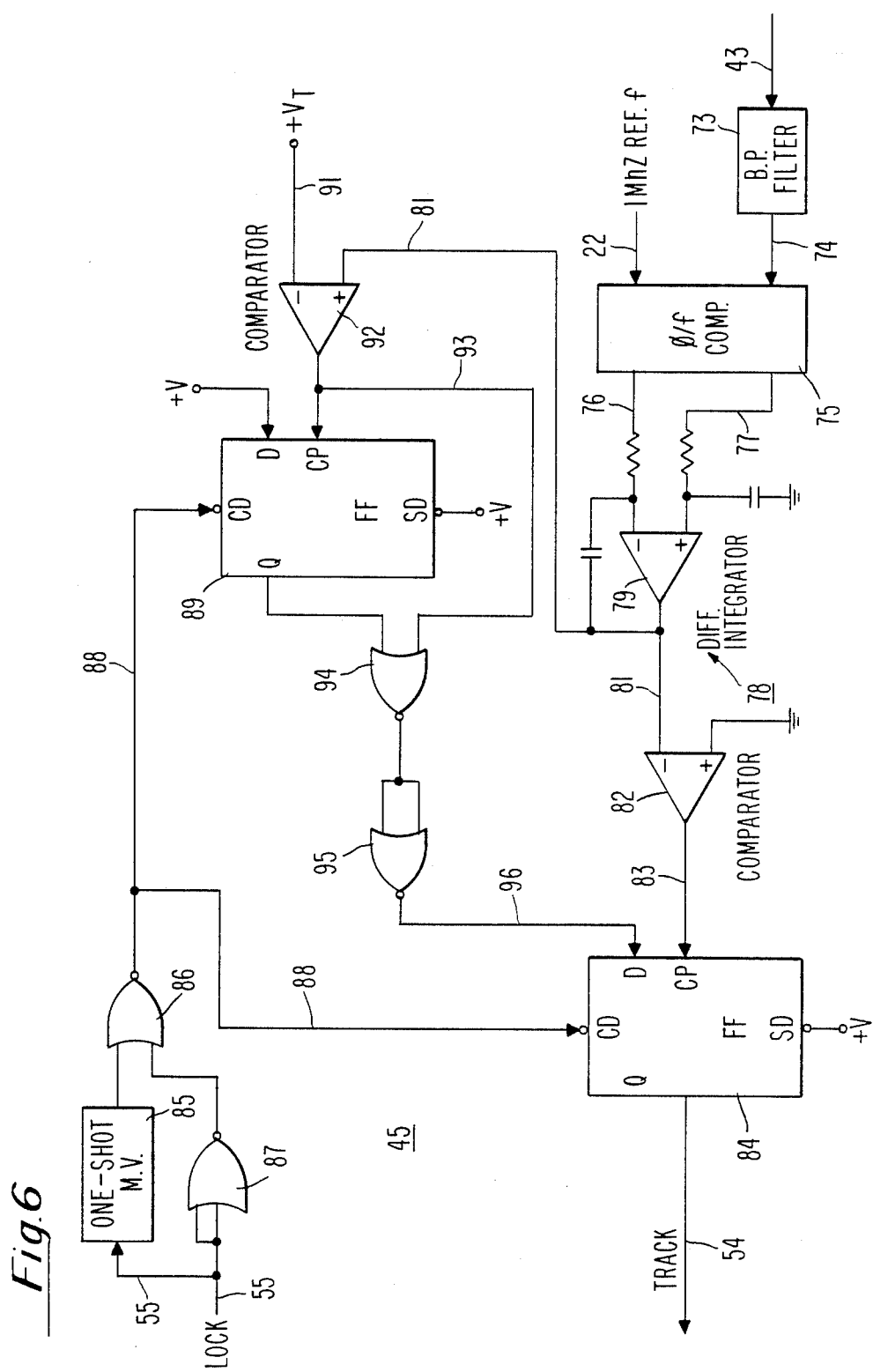
FIG. 6 is a block diagram showing a preferred embodiment coincidence detection and logic circuit of the type employed in FIGS. 4 and 5.

Refer now to FIG. 6 which is a block diagram showing a preferred embodiment coincidence detection and logic circuit of the type employed in block 45 of FIGS. 4 and 5. The frequency on input line 43 is a continuous wave signal plus noise which was described hereinbefore as a spectral line. This spectral line is affected by noise and is applied to a narrow band pass filter 73 to improve the predetection signal to noise ratio of the spectral line. The output of the predetection filter 73 on line 74 is a applied to a phase/frequency comparator 75 having a second input from the reference frequency generator on line 22 applied thereto. The phase/frequency comparator is being used in the frequency compare mode so as to compare the frequency on line 74 with the frequency on line 22 and to produce outputs on lines 76 and 77. When the frequency on input line 43 is higher than the reference frequency on line 22, a low output on line 76 is applied to the negative side of differential integrator 78 which comprises an op amp 79. When the frequency on line 43 is lower than the frequency on line 22, line 77 goes high and is applied to the positive side of the op amp 79. Thus, when the frequency on line 43 is higher than the reference frequency on line 22 line 81 goes high and when the frequency on line 43 is lower than the reference frequency on line 22 line 81 goes low. When the comparator 82 senses that it is going from high to low an output signal is produced on line 83 and applied to a D-type flip flop 84 at the clock side or CP side of flip flop 84 so as to latch the signal at the D-input of the flip flop and produce the high track signal on line 54 as explained hereinbefore. Once the track signal on line 54 is produced, the phase-locked loop is closed so as to produce an output on line 48 at the input of the summing circuit 49 as explained with regards to FIG. 5 and to cause the lock detect circuit 72 to produce a lock signal on line 55 (also shown on FIG. 5). The lock signal on line 55 is applied to a one shot multivibrator 85 which times out and produces a delayed input signal to the inverting OR gate 86. The signal on line 55 passes directly through inverting OR gate 87 and is also applied to gate 86. Thus, the signal being produced on line 88 is only effective when the lock signal on line 55 slews or goes out of lock so as to produce a delayed loss of lock signal on line 88 which is applied as a clear direct signal to flip flops 84 and 89. This signal allows the coincidence detection and logic circuit 45 to attempt another lock by driving the track signal on line 54 low. Flip flop 89 is part of an enable circuit which is employed to assure that the crossover point or detection point is from high to low. A positive threshold voltage on line 91 is applied to the comparator 92 which has as its positive input the output of differential integrator 78. As explained hereinbefore the output on line 81 can be sensed going from high to low or low to high. When the signal on line 81 is going from low to high transition, the output on line 93 goes high and passes through the two inverting OR gates 94 and 95 to provide a high data signal at the data input of flip flop 84 via line 96. When the converse is true and the signal on line 81 is going from high to low, flip flop 89 is already latched and does not affect the preferred embodiment sweep from high to low frequency as explained hereinbefore. If in the event the lock signal does not remain high, flip flops 84 and 89 are cleared by the low signal on 88 and an attempted track and lock occurs again.

Having explained a preferred embodiment long phase-locked loop carrier recovery circuit it will be appreciated that the incoming carrier frequency can deviate in frequency 10 to 100 times the main lobe bandwidth and recovery can be achieved instantaneously or as least as fast as the sweep circuit and the integrator are capable of sensing the crossover voltage point. This is to say that if a very high signal to noise ratio is present the speed with which the sweep generator may be operated is much higher than if the signal to noise ratio of the incoming signal is low. Knowing that these factors exist, the sweep generator is designed to be able to sweep at variable frequencies depending on the signal to noise ratio of the incoming signal. Thus an optimum or much faster lock on can be achieved with the preferred embodiment of the present invention explained hereinbefore.

What we claim is:

1. A long phase-locked loop (PLL) of the type having a voltage controlled oscillator (VCO), a mixer, a band pass filter, an ×2 multiplier and a phase detector connected in series and coupled as an inmput to said VCO in the phase-locked loop for locking on to an input signal applied to said mixer, the improvement comprising:

an electronic closure circuit connected in series in the phase-locked loop, summing circuit means coupled to the output of said electronic closure circuit and to the input of said VCO, a reference frequency generator, sweep frequency generator means coupled to the input of said summing circuit means for varying the frequency of in said PLL to coincide with the reference generator frequency, and a coincidence detector outside of said phase-locked loop coupled to said reference frequency generator and to the output of said ×2 multiplier for detecting coincidence of the reference frequency generator frequency with the PLL frequency output of the ×2 multiplier and for closing said phase-locked loop when coincidence is detected.

2. A long phase-locked loop as set forth in claim 1 wherein said ×2 multiplier comprises an exclusive OR gate having a loop circuit input and a delayed loop circuit input.

3. A long phase-locked loop as set forth in claim 1 wherein said electronic closure circuit comprises a differential filter connected to the output of said phase detector and to said summing circuit means.

4. A long phase-locked loop as set forth in claim 3 wherein said electronic closure circuit further comprises an electronic switch for effectively suppressing the output of said differential filter.

5. A long phase-locked loop as set forth in claim 3 wherein said closure circuit further includes a lock detector coupled to the output of said differential filter and to the input of said coincidence detector.

6. A long phase-locked loop as set forth in claim 1 wherein said coincidence detector comprises a frequency comparator connected to the output of said ×2 multiplier and to said reference frequency.

7. A long phase-locked loop as set forth in claim 6 wherein said coincidence detector further comprises a differential integrator coupled to a flip-flop for producing an output signal indicative of acquisition of said input signal.

8. A long phase-locked loop as set forth in claim 7 wherein said coincidence circuit further includes a lock acknowledge circuit coupled to said flip-flop for testing if said coincidence circuit achieved acquisition.

9. A long phase-locked loop as set forth in claim 6 wherein the output of said ×2 multiplier is filtered by a narrow band pass filter before being connected to said frequency comparator.

* * * * *